United States Patent
Reinmuth et al.

(10) Patent No.: US 10,139,424 B2
(45) Date of Patent: Nov. 27, 2018

(54) OMM ROTATION RATE SENSOR INCLUDING A DRIVE, WITHOUT STATIONARY ELECTRODES

(71) Applicant: Robert Bosch GmbH, Stuttgart (DE)

(72) Inventors: Jochen Reinmuth, Reutlingen (DE);
Andreas Lassl, Ditzingen (DE);
Odd-Axel Pruetz, Nuertingen (DE)

(73) Assignee: ROBERT BOSCH GMBH, Stuttgart (DE)

(*) Notice: Subject to any disclaimer, the term of this patent is extended or adjusted under 35 U.S.C. 154(b) by 184 days.

(21) Appl. No.: 15/209,675

(22) Filed: Jul. 13, 2016

(65) Prior Publication Data

US 2017/0016928 A1 Jan. 19, 2017

(30) Foreign Application Priority Data

Jul. 17, 2015 (DE) .................. 10 2015 213 455

(51) Int. Cl.
*G01P 3/44* (2006.01)
*B81B 7/02* (2006.01)
*G01C 19/574* (2012.01)

(52) U.S. Cl.
CPC ............. *G01P 3/44* (2013.01); *B81B 7/02* (2013.01); *G01C 19/574* (2013.01)

(58) Field of Classification Search
CPC ........................................... G01P 3/44
See application file for complete search history.

(56) References Cited

U.S. PATENT DOCUMENTS

2008/0236280 A1* 10/2008 Johnson ............ G01C 19/5719
73/504.14

* cited by examiner

*Primary Examiner* — David M. Gray
*Assistant Examiner* — Andrew V Do
(74) *Attorney, Agent, or Firm* — Norton Rose Fulbright US LLP; Gerard Messina

(57) ABSTRACT

A rotation rate sensor which includes a substrate, a first structure which is movable relative to the substrate and a second structure which is movable relative to the substrate and relative to the first structure. The first structure includes at least one first drive device and the second structure includes at least one second drive device. The first and second drive devices are situated for the joint deflection of the first structure from a neutral position of the first structure in parallel to a drive direction and of the second structure from a neutral position of the second structure in parallel to the drive direction, due to an interaction between the first and second drive devices in such a way that the first and second structures are excitable into an oscillation in phase opposition, in each case with a motion component in parallel to the drive direction.

9 Claims, 3 Drawing Sheets

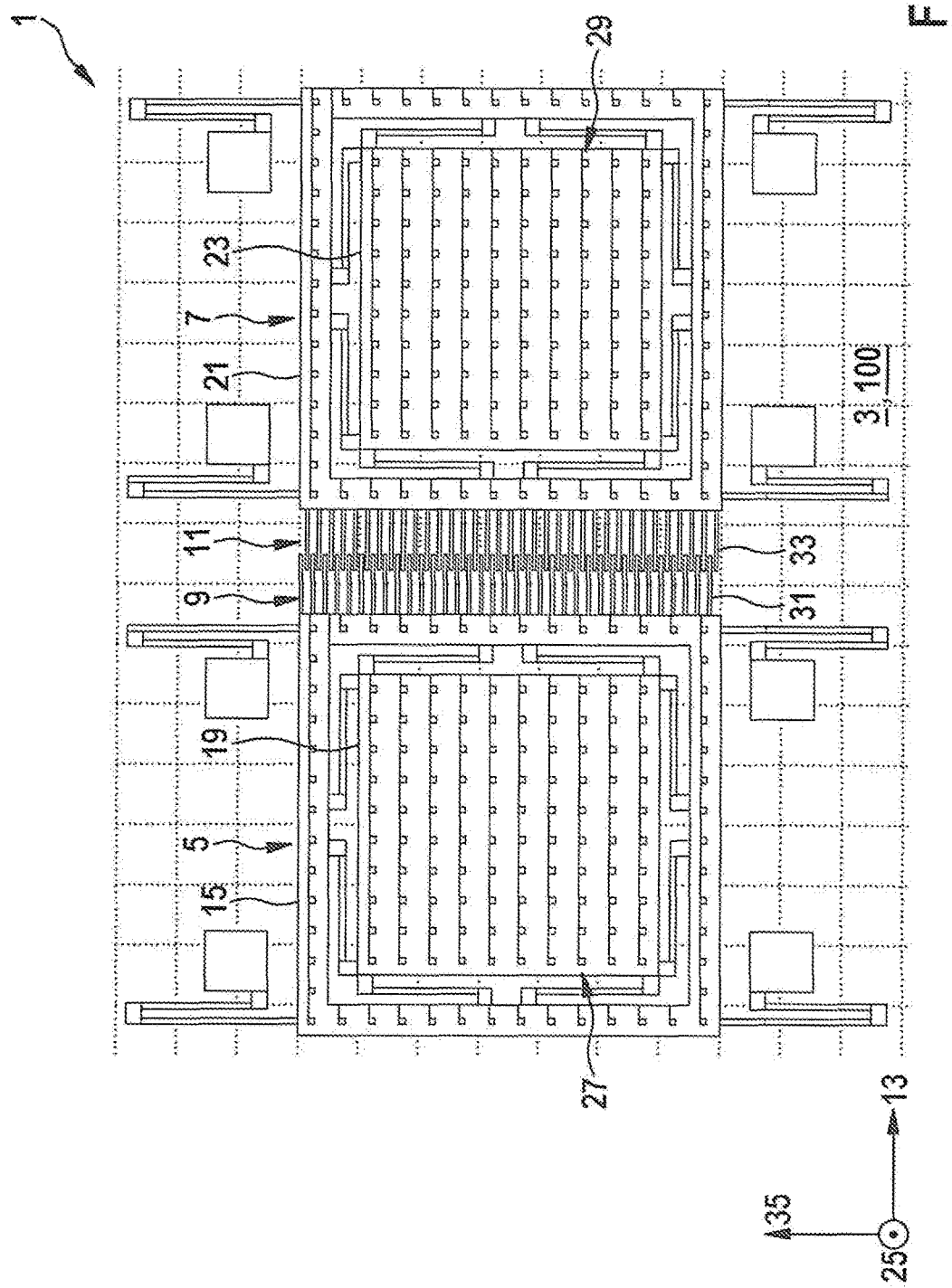

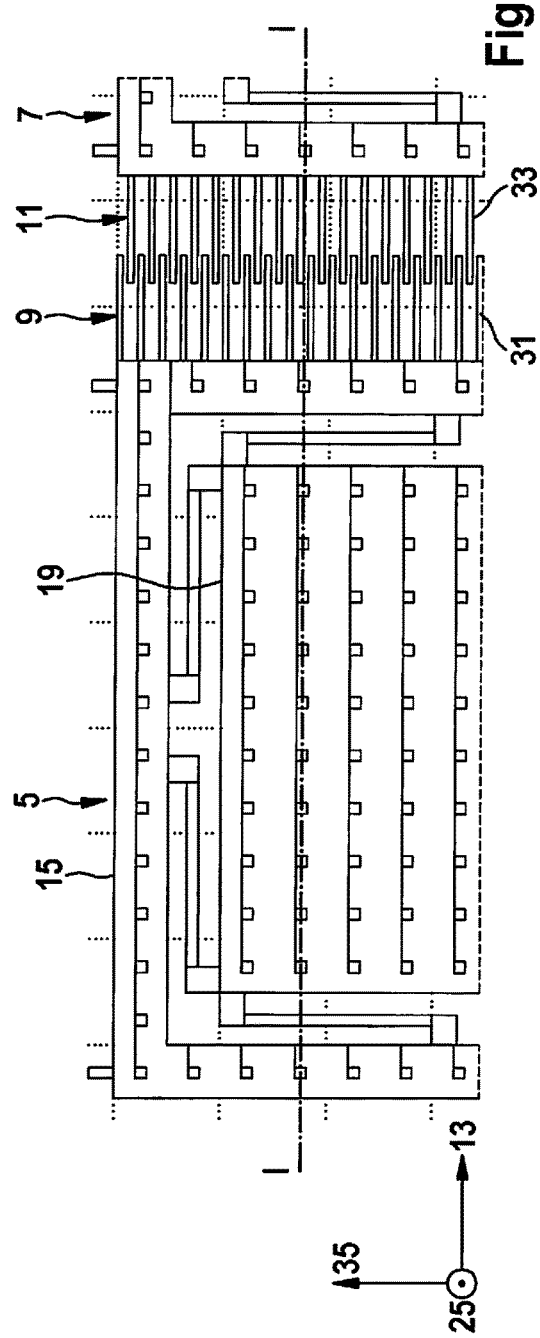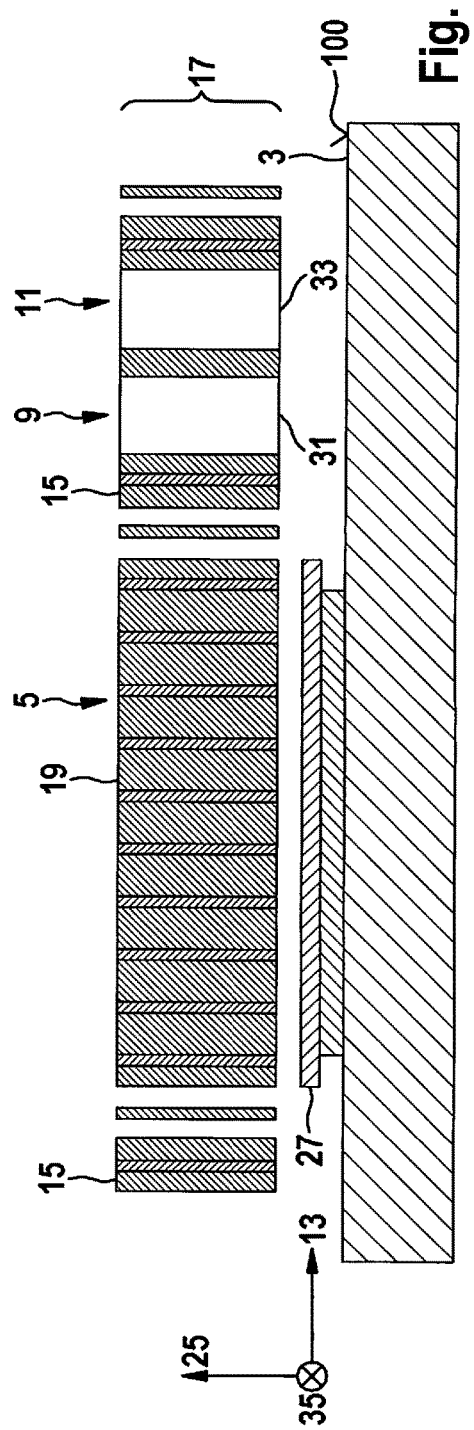

OMM ROTATION RATE SENSOR INCLUDING A DRIVE, WITHOUT STATIONARY ELECTRODES

CROSS REFERENCE

The present application claims the benefit under 35 U.S.C. § 119 of German Patent Application No. DE 102015213455.5 filed on Jul. 17, 2015, which is expressly incorporated herein by reference in its entirety.

FIELD

The present invention is directed to a rotation rate sensor including a drive without stationary electrodes.

BACKGROUND INFORMATION

Conventional rotation rate sensors often include drive devices which are fixed to the substrate and interact with the first and second drive devices in such a way that the first structure and the second structure are each deflected from their neutral positions. The first structure and the second structure are hereby excitable into an oscillation generally in phase opposition generally in parallel to a drive direction. The conventional rotation rate sensors frequently also include a coupling structure between the first structure and the second structure in order to ensure an oscillation in phase opposition of the first structure with respect to the second structure.

SUMMARY

An example rotation rate sensor according to the present invention may have an advantage over the related art that the rotation rate sensor is made possible on a substrate surface which is small relative to the related art, in a simple, mechanically robust, and cost-effective manner, since only a substrate surface which is small relative to the related art is required for the micromechanical structure for detecting rotation rates. The use of drive combs which are fixed to the substrate is hereby dispensed with. This is achieved in that the first drive device and the second drive device are situated for the joint deflection
 of the first structure from a neutral position of the first structure generally in parallel to a drive direction and
 of the second structure from a neutral position of the second structure generally in parallel to the drive direction
due to an interaction between the first drive device and the second drive device in such a way that the first structure and the second structure are excitable into an oscillation generally in phase opposition, in each case with a motion component generally in parallel to the drive direction. In the rotation rate sensor according to the present invention, a coupling takes place between the first structure and the second structure, via the drive devices, in such a way that the structures may be set into oscillation in phase opposition. Thus, depending on the power of the drive and the damping in the system, a coupling structure between the first structure and the second structure may be dispensed with. The compact design of the rotation rate sensor according to the present invention provided here also allows better reduction of spurious modes and improved optimization of vibration and stress sensitivities.

Advantageous embodiments and refinements of the present invention are described below with reference to the figures.

According to one preferred refinement, it is provided that the first structure includes a first frame structure, the first frame structure extending generally in a first plane generally in parallel to the main plane of extension, the first structure including a first detection structure, which is at least partially enclosed by the first frame structure in the first plane, for detecting an action of force on the first structure along a detection direction generally perpendicular to the drive direction due to a rotation rate of the rotation rate sensor about an axis generally perpendicular to the drive direction and generally perpendicular to the detection direction, and the second structure including a second frame structure, the second frame structure extending generally in the first plane, the second structure including a second detection structure, which is at least partially enclosed by the second frame structure in the first plane, for detecting an action of force on the second structure along a detection direction generally perpendicular to the drive direction due to a rotation rate of the rotation rate sensor about an axis generally perpendicular to the drive direction and generally perpendicular to the detection direction. A rotation rate sensor is thus advantageously provided, whereby in the measurement of a physical variable that is present, a distinction may be made between a rotation rate present at the rotation rate sensor and a linear acceleration present at the rotation rate sensor.

According to one preferred refinement, it is provided that the rotation rate sensor includes at least one first electrode situated on the substrate and/or at least one second electrode situated on the substrate, the first electrode extending generally along a plane in parallel to the main plane of extension, the first electrode being situated, at least partially, between the first structure and the substrate, and the second electrode extending generally along a plane in parallel to the main plane of extension, the second electrode being situated, at least partially, between the second structure and the substrate. This advantageously allows a rotation rate that is present at the rotation rate sensor to be capacitively ascertained.

According to one preferred refinement, it is provided that the first drive device includes at least one first comb structure, and the second drive device includes at least one second comb structure. This advantageously allows the first drive device and the second drive device to be provided in a simple, cost-effective, and mechanically robust manner. In addition, for a deflection of the first structure and the second structure comparable to the related art, this allows the comb structures of the drive device to engage with one another at twice the depth, thus providing generally twice the energy compared to the related art, at the same drive voltage. Furthermore, an interaction between the first comb structure and the second comb structure for driving the first structure and the second structure is made possible, so that a drive force comparable to the related art with generally one-half the voltage difference compared to the related art, generated by a charge pump in an application-specific integrated circuit (ASIC), is achievable with the aid of a polarity reversal.

According to one preferred refinement, it is provided that the first comb structure is connected to the first frame structure and/or to the first detection structure, and the second comb structure is connected to the second frame structure and/or to the second detection structure. A drive of the first structure via the first frame structure and/or via the first detection structure, and a drive of the second structure via the second frame structure and/or via the second detection structure, are thus advantageously possible.

According to one preferred refinement, it is provided that the first comb structure is generally electrically insulated from the first frame structure and/or generally electrically insulated from the first detection structure, and the second comb structure is generally electrically insulated from the second frame structure and/or generally electrically insulated from the second detection structure. It is thus advantageously possible to use conventional electrical wiring.

According to one preferred refinement, it is provided that the first comb structure is connected to the first frame structure in a generally electrically conductive manner and/or is connected to the first detection structure in a generally electrically conductive manner, and the second comb structure is connected to the second frame structure in a generally electrically conductive manner and/or is connected to the second detection structure in a generally electrically conductive manner. It is thus advantageously possible for the drive and the detection to take place in a multiplex operation and/or as a suitable superimposition of evaluation signals and drive signals.

According to one preferred refinement, it is provided that the first structure includes a first drive detection device, and the second structure includes a second drive detection device, the first drive detection device and the second drive detection device being situated for detecting the joint deflection
- of the first structure from a neutral position of the first structure generally in parallel to a drive direction and
- of the second structure from a neutral position of the second structure generally in parallel to the drive direction due to an interaction between the first drive detection device and the second drive detection device. This advantageously allows the drive detection of the rotation rate sensor according to the present invention to be provided on a small substrate surface. In addition, this allows phase inaccuracies and/or location-dependent amplitude differences to be minimized.

According to one preferred refinement, it is provided that the first drive detection device includes at least one first detection comb structure, and the second drive detection device includes at least one second detection comb structure. A simple, mechanically robust, and cost-effective drive detection is advantageously provided in this way.

According to one preferred refinement, it is provided that the rotation rate sensor includes an electrical connection, the electrical connection being provided for the first drive device and for the second drive device, and/or the electrical connection being provided for the first detection structure and the second detection structure. A rotation rate sensor is thus advantageously provided which is easily driven, and which also provides a measuring signal based on a physical variable present at the rotation rate sensor.

The rotation rate sensor according to the present invention is provided for detecting rotation rates about an axis, but in particular the use of the features described here for multi-axial rotation rate sensors, i.e., rotation rate sensors for measuring rotation rates about up to three mutually perpendicular axes, is also provided. The mutual drive of structures which are movable relative to the substrate and relative to one another is preferably provided. Coupling structures for transmitting drive motions are also preferably provided.

BRIEF DESCRIPTION OF THE DRAWINGS

FIG. 1 shows a schematic illustration of a rotation rate sensor according to one exemplary specific embodiment of the present invention.

FIG. 2a shows an enlarged detail of the schematic illustration of the rotation rate sensor according to FIG. 1.

FIG. 2b shows a sectional view of the rotation rate sensor according to FIG. 2a on a sectional area of a section along line I-I in FIG. 2a.

DETAILED DESCRIPTION OF EXAMPLE EMBODIMENTS

Figure 3:
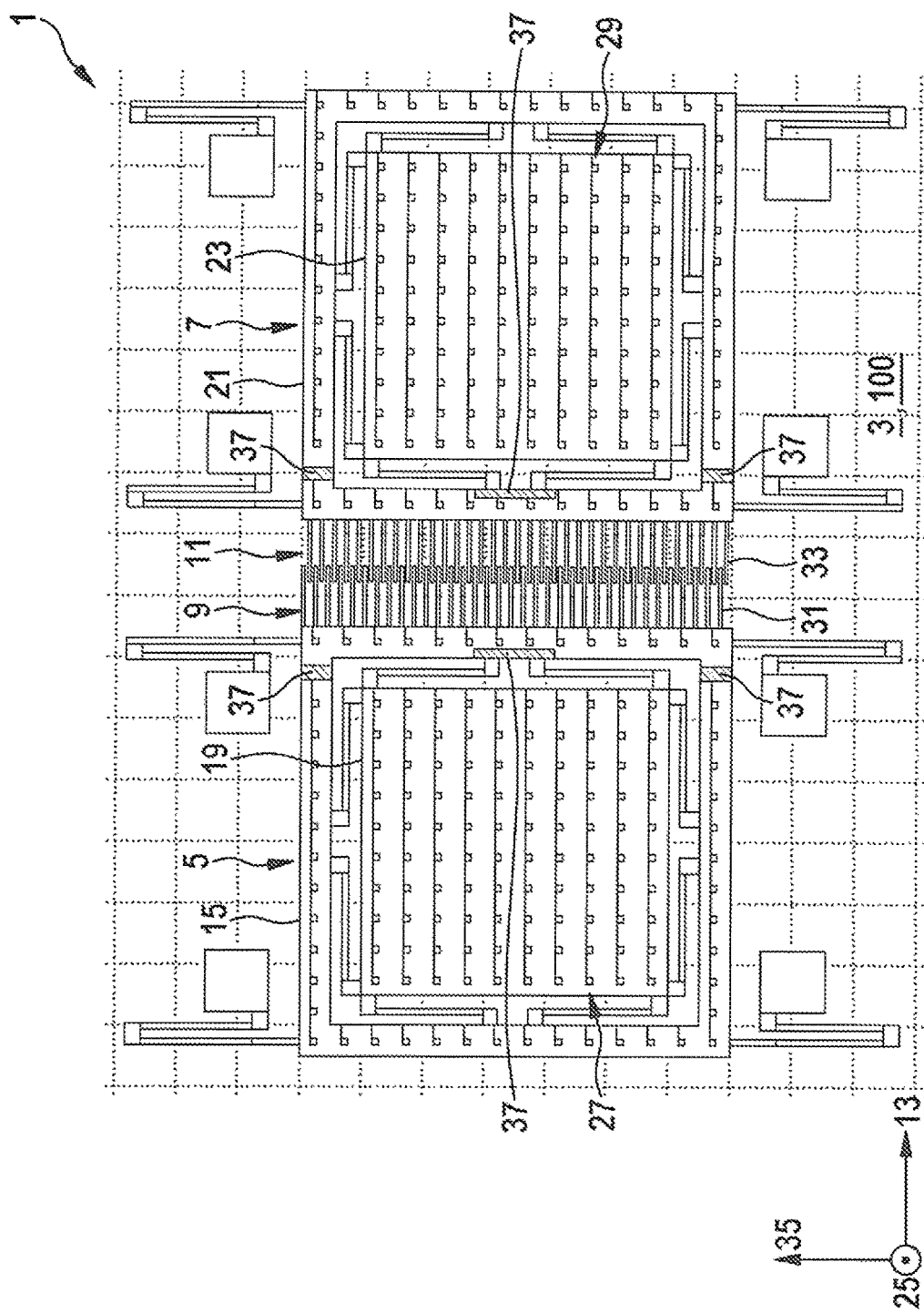
FIG. 3 shows a schematic illustration of a rotation rate sensor according to one exemplary specific embodiment of the present invention.

Identical parts are always provided with the same reference numerals in the various figures, and therefore are generally designated or mentioned only once in each case.

FIG. 1 shows a schematic illustration of a rotation rate sensor 1 according to one exemplary specific embodiment of the present invention, rotation rate sensor 1 including a substrate 3 having a main plane of extension 100, a first structure 5 which is movable relative to substrate 3, and a second structure 7 which is movable relative to substrate 3 and relative to first structure 5. First structure 5 includes a first drive device 9, and second structure 7 includes a second drive device 11. First drive device 9 and second drive device 11 include a first comb structure 31 and a second comb structure 33, respectively, for example as illustrated in FIG. 1, and for joint deflection of first structure 5 and of second structure 7 from a neutral position of the particular structure 5, 7 generally in parallel to a drive direction 13 due to an interaction between first drive device 9 and second drive device 11, are each situated in such a way that first structure 5 and second structure 7 are excitable into an oscillation generally in phase opposition, in each case with a motion component generally in parallel to drive direction 13.

In rotation rate sensor 1 illustrated in FIG. 1, first structure 5 includes a first frame structure 15 and a first detection structure 19, and second structure 7 includes a second frame structure 21 and a second detection structure 23. First detection structure 19 and second detection structure 23 are situated for detecting an action of force on first structure 5 and detecting an action of force on second structure 7, respectively, along a detection direction 25 due to a rotation rate of rotation rate sensor 1 about an axis generally in parallel to a direction 35. In the exemplary embodiment illustrated in FIG. 1, first comb structure 31 is connected to first frame structure 15, and second comb structure 33 is connected to second frame structure 21. Alternatively or additionally, however, it is possible and likewise preferred for first comb structure 31 to be connected to first detection structure 19 and/or for second comb structure 33 to be connected to second detection structure 23.

FIG. 2a shows an enlarged detail of the schematic illustration of the rotation rate sensor according to FIG. 1. FIG. 2b illustrates a sectional view of the rotation rate sensor on a sectional area of a section along line I-I in FIG. 2a. FIG. 2b shows a first electrode 27 which is situated on substrate 3 and which extends along a plane generally in parallel to main plane of extension 100 and which is situated, at least partially, between first structure 5 and substrate 3. The rotation rate sensor illustrated in FIG. 1 includes a second electrode 29 which is situated on the substrate and which extends along a plane generally in parallel to main plane of extension 100 and which is situated, at least partially, between second structure 7 and substrate 3.

First structure 5 and second structure 7 of the rotation rate sensor illustrated in FIGS. 1, 2a, and 2b preferably additionally include an optional first drive detection device, not illustrated, which preferably includes a first detection comb structure, and a second drive detection device, not illustrated, which preferably includes a second detection comb structure. The first drive detection device and the second drive detection device are situated for detecting the joint deflection of first structure 5 and of second structure 7 from the particular neutral position of structures 5, 7 generally in parallel to drive direction 13 due to an interaction between the first drive detection device and the second drive detection device.

In addition, rotation rate sensor 1 includes an electrical connection, not illustrated. The electrical connection is preferably provided for first drive device 9 and also for second drive device 11, and/or for first detection structure 19 and also for second detection structure 23.

FIG. 3 shows a schematic illustration of a rotation rate sensor 1 according to another exemplary specific embodiment of the present invention, rotation rate sensor 1 illustrated in FIG. 3 generally corresponding to rotation rate sensor 1 illustrated in FIGS. 1, 2a, and 2b, except that in rotation rate sensor 1 illustrated in FIG. 3, first comb structure 31 is generally electrically insulated from first frame structure 15 and is generally electrically insulated from first detection structure 19. Correspondingly, second comb structure 33 is generally electrically insulated from second frame structure 21 and is generally electrically insulated from second detection structure 23. The electrical insulation is depicted by electrical insulation areas 37 in FIG. 3.

What is claimed is:

1. A rotation rate sensor, comprising:
a substrate having a main plane of extension;
a first structure which is movable relative to the substrate, the first structure including at least one first drive device; and
a second structure which is movable relative to the substrate and relative to the first structure, the second structure including at least one second drive device;
wherein the first drive device and the second drive device are situated for joint deflection:
of the first structure from a neutral position of the first structure in parallel to a drive direction, and
of the second structure from a neutral position of the second structure in parallel to the drive direction,
due to an interaction between the first drive device and the second drive device in such a way that the first structure and the second structure are excitable into an oscillation in phase opposition, in each case with a motion component in parallel to the drive direction, wherein at least a portion of the first drive device and at least a portion of the second drive device overlap one another along an axis that is perpendicular to the drive direction.

2. The rotation rate sensor as recited in claim 1, wherein the first structure includes a first frame structure, the first frame structure extending in a first plane in parallel to the main plane of extension, the first structure including a first detection structure, which is at least partially enclosed by the first frame structure in the first plane, for detecting an action of force on the first structure along a detection direction perpendicular to the drive direction due to a rotation rate of the rotation rate sensor about an axis perpendicular to the drive direction and perpendicular to the detection direction, and the second structure including a second frame structure, the second frame structure extending in the first plane, the second structure including a second detection structure, which is at least partially enclosed by the second frame structure in the first plane, for detecting an action of force on the second structure along a detection direction perpendicular to the drive direction due to a rotation rate of the rotation rate sensor about an axis perpendicular to the drive direction and perpendicular to the detection direction.

3. The rotation rate sensor as recited in claim 1, wherein the rotation rate sensor includes at least one of: i) at least one first electrode situated on the substrate, and ii) at least one second electrode situated on the substrate, the first electrode extending along a plane in parallel to the main plane of extension, the first electrode being situated, at least partially, between the first structure and the substrate, and the second electrode extending along a plane in parallel to the main plane of extension, the second electrode being situated, at least partially, between the second structure and the substrate.

4. The rotation rate sensor as recited in claim 2, wherein the first drive device includes at least one first comb structure, and the second drive device includes at least one second comb structure.

5. The rotation rate sensor as recited in claim 4, wherein the first comb structure is connected at least one of: i) to the first frame structure, and ii) to the first detection structure, and the second comb structure is connected at least one of: i) to the second frame structure, and ii) to the second detection structure.

6. The rotation rate sensor as recited in claim 4, wherein the first comb structure is at least one of: i) electrically insulated from the first frame structure, and ii) electrically insulated from the first detection structure, and the second comb structure is at least one of: i) electrically insulated from the second frame structure, and ii) electrically insulated from the second detection structure.

7. The rotation rate sensor as recited in claim 1, wherein the first structure includes a first drive detection device, and the second structure includes a second drive detection device, the first drive detection device and the second drive detection device being situated for detecting joint deflection:
i) of the first structure from a neutral position of the first structure in parallel to a drive direction, and
ii) of the second structure from a neutral position of the second structure in parallel to the drive direction,
due to an interaction between the first drive detection device and the second drive detection device.

8. The rotation rate sensor as recited in claim 1, wherein the first drive detection device includes at least one first detection comb structure, and the second drive detection device includes at least one second detection comb structure.

9. The rotation rate sensor as recited in claim 1, wherein the rotation rate sensor includes an electrical connection, the electrical connection being provided for at least one of: i) the first drive device and for the second drive device, and ii) the first detection structure and the second detection structure.

* * * * *